United States Patent
Franck

[11] Patent Number: 6,137,235
[45] Date of Patent: Oct. 24, 2000

[54] LOW-RESISTANCE BIPOLAR BRIDGE CIRCUIT

[75] Inventor: Felix Franck, Munich, Germany

[73] Assignee: Patent-Treuhand-Gesellschaft fur elektrische Gluehlampen mbH, Munich, Germany

[21] Appl. No.: 09/362,908

[22] Filed: Jul. 29, 1999

[30] Foreign Application Priority Data

Aug. 26, 1998 [DE] Germany .................... 198 38 829

[51] Int. Cl.[7] .................................................. H05B 37/02

[52] U.S. Cl. ...................... 315/224; 315/219; 315/276; 315/DIG. 5; 315/DIG. 7

[58] Field of Search .................... 315/209 R, 224, 315/225, 276, 283, 289, 291, 307, DIG. 2, DIG. 5, DIG. 7, 219

[56] References Cited

U.S. PATENT DOCUMENTS

| | | | |
|---|---|---|---|
| 4,259,616 | 3/1981 | Smith | 315/DIG. 5 |
| 5,138,236 | 8/1992 | Bobel et al. | 315/307 |
| 5,291,101 | 3/1994 | Chandrasekaran | 315/DIG. 7 |
| 5,399,943 | 3/1995 | Chandrasekaran | 315/219 |
| 5,434,477 | 7/1995 | Crouse et al. | 315/209 R |
| 5,825,136 | 10/1998 | Rudolph | 315/291 |

FOREIGN PATENT DOCUMENTS 19728295  1/1999  Germany .................... H05B 41/29

*Primary Examiner*—Don Wong
*Assistant Examiner*—Thuy Vinh Tran
*Attorney, Agent, or Firm*—Carlo S. Bessone

[57] ABSTRACT

The invention relates to optimized-loss base drive for a bipolar transistor bridge oscillator circuit, by using base series capacitors and by not having any non-reactive resistances in the base drive circuits.

15 Claims, 1 Drawing Sheet

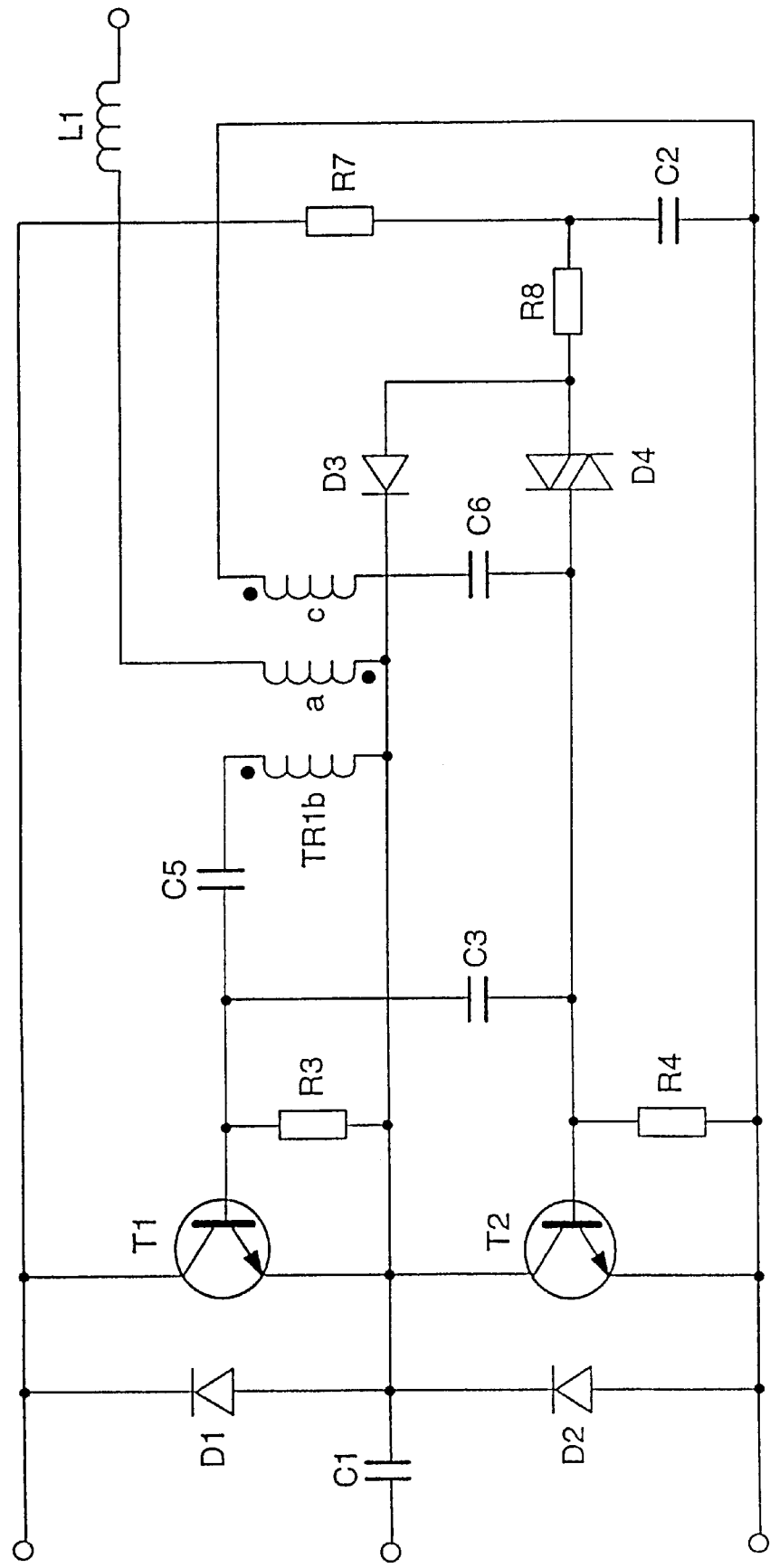

LOW-RESISTANCE BIPOLAR BRIDGE CIRCUIT

TECHNICAL FIELD

The present invention relates to an operating circuit for a load, in particular a low-pressure discharge lamp. In this case, the invention is based on an oscillator circuit for high-frequency operation of the load which, on the one hand, is supplied by a voltage having a dominant DC element and, on the other hand, by virtue of a bridge circuit forms the high-frequency power supply for the load, that is to say in particular the lamp.

PRIOR ART

Bipolar transistor bridges are frequently used, for various technical reasons, in such oscillator circuits. High-frequency supply potentials are produced at appropriate tapping points on the bridge circuit by switching the bases of the bipolar transistors off and on with appropriate control, corresponding to the operating frequency of the bridge circuit. This is carried out—in general terms—by a switching control device, in which case it is possible to operate just as well with an externally preset nominal frequency as with a feedback design which leads to free oscillation of the bridge circuit.

Various difficulties have arisen in this case. For example, the bases of the bipolar transistors are conventionally driven and heavily saturated by a large current pulse, so that the switching-on time is governed by the storage time of the bipolar transistor. The corresponding switching currents lead to high losses in the base connecting lines and/or in conventionally usual base resistances, as well as in the bipolar transistor itself. Furthermore, this results in the switching-off time being heavily dependent on the storage time of the respective bipolar transistor. The bipolar transistors must therefore be carefully selected in this case in order to comply with particular specifications.

DESCRIPTION OF THE INVENTION

The invention is based on. the technical problem of improving the operating characteristics of the above oscillator circuits, in particular with regard to their losses.

According to the invention, this problem is solved by an oscillator circuit for operating a load having a bipolar transistor bridge and a switching control device for driving the base or bases of the bipolar transistor or transistors via a respective base connecting line, characterized by a base series capacitor in ones of the base connecting lines between the switching control device and one of the bipolar transistors, or on the side of the switching control device, remote from the transistor, in a connecting line (connected in series therewith) of the switching control device to a tap or a supply potential for the bipolar transistor bridge, and in that no semiconductor components, in particular semiconductor switches, are located in the base connecting line between the switching control device and the bipolar transistor or, on the side remote from the transistor, in the connecting line in series with the base series capacitor.

Thus, according to the invention, an additional capacitor which is in this case called a base series capacitor is inserted into the drive circuit of a base, preferably at least one base series capacitor for each bipolar transistor in the bridge. As stated above, this base series capacitor is located in the base connecting line, or in series with it, on the other side of the switching control device (if present), in its connecting line to the bipolar transistor bridge. During operation of the circuit, the base series capacitor is used for storing a voltage to switch off the respective transistor. An NPN transistor is thus switched off, for example, by a negative emitter base voltage; the losses for driving the switching transistors in the bridge circuit are accordingly optimized.

In particular, no further semiconductor components, in particular semiconductor switches, are required or provided in series with the base drive circuits in order to control or to optimize the switching-off process. This allows inherent losses in such components, undesirable parasitic effects and a disadvantageous rise in the production costs of the circuit to be avoided. The term semiconductor components means, in particular, further transistors as well as diodes. In particular, there is no need to operate the switching transistors to a major extent while in the saturation region. In fact, according to the invention, they are operated only slightly beyond their saturation point, as a result of which they react better to being driven by the switching control device together with the base series capacitor. The influence of the storage time of the relevant bipolar transistor is thus considerably reduced. The already mentioned complex selection of the transistors is thus now required only to a minor extent, if at all.

It is furthermore preferable for there not to be any non-reactive resistances located in the base connecting line or on the side of the switching control device remote from the transistor, either. This, of course, means no parasitic resistances but only resistances which are deliberately planned in the design, in particular discrete resistances. This not only further reduces the losses during oscillator circuit operation, but also the storage times caused by non-reactive resistances in conjunction with the unavoidable parasitic capacitances, particularly in the transistor itself. As before, the term base connecting line relates to the line path between the switching control device and the corresponding bipolar transistor in the bridge circuit, and the term connecting line (on the side remote from the transistor) refers to the line path between the switching control device and the bridge itself, that is to say one of the taps or supply potentials.

It is furthermore preferable for the emitter paths also all to be free of non-reactive resistances, that is to the say the line paths between the emitter of the respective bipolar transistor and the corresponding nearest tap or supply potential of the bridge circuit. This once again reduces the losses and the RC storage times. Such emitter resistances are common in the prior art, to be precise, inter alia, in order to achieve, in conjunction with a base protection resistance connected in parallel with the emitter-base junction, a positive feedback effect during switch-off, via the potential between the emitter resistance and the emitter, which potential is tapped off by the base protection resistance and varies rapidly during switching-off owing to the emitter resistance. This measure is superfluous as a result of the switching control device in conjunction with the base series capacitor according to the invention.

For the reasons which have already been mentioned for reducing losses and impedance storage times, there are preferably also no inductances (apart from parasitic inductances) in the base connecting line and in the connecting line of the switching control device. According to a further embodiment, an additional capacitor is provided between the base connecting lines, a so-called base bridge capacitor. Its function is to avoid so-called collector initial current spikes and to prevent any damaging bridge short, and it thus assists switching control and switching load relief at the right time. This capacitor may have, for example, a capacitance of between 100 and 220 pF. With regard to the method of operation of such a base bridge capacitor, reference should be made on the one hand to the exemplary embodiment in this application and, furthermore, to the parallel application by the same applicant, with the File Reference DE 197 28 295.4. In particular, the disclosure content of the parallel application relating to the method of operation, circuitry and preferred dimensioning of the base bridge capacitor is included by reference in this application.

As has already been mentioned, the switching current in the case of the invention is designed to be reduced (in comparison with the heavy saturation in the prior art), and is preferably in the region of 1.5 to 3 times that minimum switching current at which the bipolar transistor is just saturated.

Furthermore, it is preferred for this switching current, which is taken from the base series capacitor, to be compensated for in the operating periods of the circuit with the relevant bipolar transistor being switched off via a parallel resistance in parallel with the base series capacitor (in order to produce an equalized current or charge balance). This parallel resistance may also be located in parallel with the series circuit comprising the base capacitor and the switching control device, provided the switching control device is connected to the bridge circuit on the side remote from the transistor. The parallel resistance is preferably at the same time a conventional base protection resistance as well. A favorable range for its value is between 100 and 1000 ohms.

A further aspect in this case is for the parallel resistance to be designed as a controllable resistance, for example a temperature-dependent resistance. It is thus possible to straighten out the temperature response of the switching frequency of the oscillator circuit.

A further option is a directly controllable resistance. Bipolar or MOS transistors may be used in the linear operating region. Although the oscillator circuit may in this case still be a free-running circuit, the frequency may be actively influenced externally, in this way. Finally, alternatively, the use of an optocoupler as a directly controllable resistance is also feasible in this case.

In particular, the invention can be applied to half-bridge oscillator circuits comprising bipolar transistors as can be used, in particular, for operating low-pressure discharge lamps. In this case, a control transformer is preferably used as the switching control device. In a further preferred manner, the transformer is designed to be saturated. The bipolar transistors are switched off by the saturation of the control transformer or by its magnetization current—depending on the current in the load circuit inductance in series with the lamp (in an electronic ballast for a lamp)—and in conjunction with the already described base series capacitor, in which case there is no need for any further resistive or inductive components. In fact, the secondary windings of the control transformer store their drive power as a voltage or charge in the appropriate relatively large base series capacitor which, for its part, ensures that the bipolar transistor is switched off with an appropriate base-emitter voltage (negative for NPN transistors, positive for PNP transistors). When the base of the bipolar transistor is conducting, the secondary winding of the control transformer is magnetized and/or saturated.

In order not to saturate the bipolar transistor bases with an excessively high switching current on the basis of the method of operation of the invention explained initially, the turns ratio between the primary winding and the secondary winding of the control transformer is preferably chosen to be unity or less, according to the invention. This limits the secondary current.

One important aspect in this context is that, when the described control transformer is in the saturation region, the voltage on the base series capacitor (which is obtained at the same time from the voltage induced in the secondary winding of the control transformer by the current in the primary winding) is proportional to the operating frequency of the oscillator circuit. This thus results in synchronized coupling between the load current amplitude and the operating frequency. Thus, according to the invention, suitable matching of the load circuit allows power negative feedback to such an extent as to achieve at least approximate regulation at a constant power level.

DESCRIPTION OF THE DRAWINGS

Further details and features of the invention result from the description which now follows of an exemplary embodiment, and these may each be significant to the invention on their own or in any desired combination. The exemplary embodiment is illustrated in the FIGURE, as a simplified circuit diagram.

A supply voltage with a dominant DC element is fed in at the two connections at the extreme left-hand edge of the circuit diagram, right at the top and right at the bottom, by means of a circuit which is not illustrated in any more detail, with the positive supply potential at the top and the negative potential, or ground, being located at the bottom. A half bridge comprising two bipolar transistors T1 and T2 extends between the two supply potential paths, each of which bipolar transistors T1 and T2 has a freewheeling diode D1 and D2, respectively (which are known to the person skilled in the art), in parallel with the collector-emitter path. A high-frequency potential, which oscillates in an appropriate manner between the two supply potentials, is produced for the load, in this case for a low-pressure gas-discharge lamp, at the center tap of the half bridge between the two bipolar transistors T1 and T2 by switching the transistors on and off alternately.

A trapezoidal-waveform capacitor which is denoted by C1 acts on the center tap of the half bridge, and its other connection is connected to one of the two supply potentials. Two trapezoidal-waveform capacitors may also be provided, respectively in parallel with one of the bipolar transistors T1 or T2. The function of the trapezoidal-waveform capacitor C1 is to cause the potential rise on the center tap after a bipolar transistor T1 or T2, respectively, has been switched off to be inclined, by virtue of its finite charging and discharging time, with an appropriate flank, on the potential/time graph. This represents the prior art which is known per se and will not be described in any further detail here. In any case, this results in improved switching load relief and improved electromagnetic compatibility.

On the other hand, the center tap is connected via a primary winding TR1a of a control transformer TR1 and via a load inductance L1 (lamp inductor) to a supply connection for the low-pressure discharge lamp (with known circuitry), which is otherwise not illustrated in any more detail. The other connection of the lamp may be connected via a coupling capacitor with one of the two supply potential paths, or with two coupling capacitors to both supply potential paths.

Positive feedback of the high-frequency load current via the control transformer TR1, that is to say via its secondary windings b and c, to the base connections of the bipolar transistors T1, T2 leads to the half-bridge circuit operating in a free-running oscillation mode, overall. In this case, the winding orientation indicated by the points on the control transformer TR1 ensures that the current is respectively applied in opposite senses to the bases of the switching transistors T1, T2 in the half bridge.

The line path between the control transformer TR1 and the respective base connection in each case passes via a base series capacitor C5 or C6, respectively, in order to assist the switching-off processes for the bipolar transistor T1 or T2, respectively (as a result of a negative base voltage owing to the DC-voltage isolation with respect to the control transformer). These capacitors have a capacitance of between 1 and 4.7 F and need only a low required dielectric strength of about 20 V. In this case, the sequence of the respective secondary windings TR1b and TR1c and of the respective base series capacitor C5 or C6, respectively, may be interchanged individually or on both sides.

There is a tap in each case between the respective base series capacitor C5 or C6 and the base of the associated bipolar transistor T1 or T2, respectively, in which case the two taps are connected through a base bridge capacitor C3 of between 100 pF and 220 pF (reference should once again be made to the exemplary embodiment of the parallel application DE 197 28 295.4, to be precise also with respect to the various circuitry options for this base bridge capacitor C3). In potential terms, the base bridge capacitor C3 is located essentially between the center tap of the half bridge and ground. Thus, any potential change at the center tap changes its charging or discharging in such a direction that the next transistor to be switched on is not switched until after the potential change at the center tap has been completed.

Furthermore, in order to equalize the current balance in the base series capacitors C5 and C6, a resistor R3 is provided between the center tap and the base of the upper bipolar transistor T1, and a resistor R4 is provided between ground and the base of the lower bipolar transistor T2. Their value is generally 470 ohms. They ensure that current flows when the base is not switched on, in such a manner that a pure alternating current flows through the relevant base series capacitor C5 or C6, despite the DC element in the base current.

This value of 470 ohms for the resistors R3 and R4 is considerably higher than for comparable conventional base protection resistances. The value is sufficient to produce an equalized current balance in the respective base series capacitor C5 or C6, respectively, but does not couple the base drive circuit excessively strongly to the center tap or ground, respectively. In this case, it must be remembered that the maximum permissible collector-emitter voltage $U_{CER}$ of the respective bipolar transistor T1 or T2, respectively (collector-emitter maximum voltage when the base and emitter are connected via a resistor R whose resistance is not excessively high), which is considerably greater than the dielectric strength with an open base $U_{CEO}$, is likewise ensured by use of these parallel resistors R3 and R4. This function is also satisfied in the case (mentioned in the introduction to the description) of direct parallel connection of the base series capacitor C5 or C6, respectively, and of the associated parallel resistor R3 or R4, respectively—that is to say the respective lower connection of the parallel resistor is between the base series capacitor C5 or C6, respectively— and the associated secondary winding TR1b or TR1c, respectively, since the resistances of the secondary windings are comparatively low.

Furthermore, an oscillation excitation circuit is shown, to be precise comprising the resistor R7, the diode D3, the diac D4 and the capacitor C2. This circuit has the resistor R8 (of between 10 and 22 ohms) added to it. The technical background is the need for current limiting in the diac D4 and the diode D3, which keep the voltage across the capacitor C2 very low during operation of the bipolar transistor half-bridge T1, T2. This is intended to suppress intermediate triggering of the diac D4 during operation. Current limiting by the resistor R8 which can be inserted is particularly important for radio interference suppression.

What is claimed is:

1. An oscillator circuit for operating a load having a bipolar transistor bridge (T1, T2) and a switching control device (TR1) for driving the base or bases of the bipolar transistor or transistors (T1, T2) via a respective base connecting line, wherein a base series capacitor (C5, C6) is connected into one of the base connecting lines between the switching control device (TR1) and one of the bipolar transistors (T1, T2), or on the side of the switching control device (TR1), remote from the transistor, is connected into a connecting line (connected in series therewith) of the switching control device (TR1) to a tap or a supply potential for the bipolar transistor bridge (T1, T2), wherein no semiconductor component is located in the base connecting line between the switching control device (TR1) and the bipolar transistor (T1, T2) or, on the side remote from the transistor, in the connecting line in series with the base series capacitor (C5, C6), and wherein the base connecting lines of the bipolar transistors (T1, T2) are connected to one another by means of a base bridge capacitor (C3), in each case between the switching control device (TR1) and the bipolar transistor (T1, T2).

2. The circuit as claimed in claim 1, wherein the base series capacitor (C5, C6) has a capacitance of 1 F to 4.7 F.

3. The circuit as claimed in claim 1, wherein no nonreactive resistance is located in the base connecting line between the switching control device (TR1) and the bipolar transistor (T1, T2) or on the side remote from the transistor in the connecting line in series with the base series capacitor (C5, C6).

4. The circuit as claimed in claim 1, wherein no inductances are located in the base connecting line between the switching control device (TR1) and the bipolar transistor (T1, T2) or on the side remote from the transistor in the connecting line in series with the base series capacitor (C5, C6).

5. The circuit as claimed in claim 1, wherein no nonreactive resistance is located in an emitter path of a bipolar transistor (T1, T2).

6. The circuit as claimed in claim 1, wherein the base bridge capacitor (C3) has a capacitance of between 100 pF and 220 pF.

7. The circuit as claimed in claim 1, wherein the switching current for the bases of the bipolar transistors (T1, T2) is 1.5 to 3 times the minimum switching current.

8. The circuit as claimed in claim 1, wherein the circuit is provided with power negative feedback by virtue of the fact that the load current is dependent on the operating frequency of the bipolar transistor bridge (T1, T2).

9. The circuit as claimed in claim 1, wherein a parallel resistor (R3, R4) is located in parallel with the series circuit comprising the base series capacitor (C5, C6) and the switching control device (TR1).

10. The circuit as claimed in claim 9, wherein the parallel resistor (R3, R4) also acts as a base protection resistance for the bipolar transistor (T1, T2).

11. The circuit as claimed in claim 9, wherein the parallel resistor (R3, R4) has a value of between 100 ohms and 1000 ohms.

12. The circuit as claimed in claim 1, wherein a parallel resistor (R3, R4) is located in parallel with the base series capacitor (C5, C6).

13. The circuit as claimed in claim 1, wherein the bipolar transistor bridge is a half bridge (T1, T2).

14. The circuit as claimed in claim 1, wherein the switching control device is a control transformer (TR1).

15. The circuit as claimed in claim 14, wherein the primary-to-secondary turns ratio of the control transformer (TR1) is less than or equal to unity.

* * * * *